US009291671B2

(12) United States Patent
Sunaga et al.

(10) Patent No.: US 9,291,671 B2
(45) Date of Patent: Mar. 22, 2016

(54) SEMICONDUCTOR INTEGRATED CIRCUIT (71) Applicant: Hitachi, Ltd., Tokyo (JP)

(72) Inventors: Yasuyoshi Sunaga, Tokyo (JP); Hideki Sakakibara, Tachikawa (JP); Yuko Ito, Akishima (JP); Tomoji Nakamura, Fussa (JP); Atsushi Hazeyama, Ome (JP); Kozaburo Kurita, Ome (JP); Koki Tsutsumida, Ome (JP)

(73) Assignee: Hitachi, Ltd., Tokyo (JP)

( * ) Notice: Subject to any disclaimer, the term of this patent is extended or adjusted under 35 U.S.C. 154(b) by 51 days.

(21) Appl. No.: 14/084,182

(22) Filed: Nov. 19, 2013

(65) Prior Publication Data
US 2014/0070863 A1 Mar. 13, 2014

Related U.S. Application Data (62) Division of application No. 12/849,807, filed on Aug. 3, 2010, now abandoned.

(30) Foreign Application Priority Data

Sep. 28, 2009 (JP) ................. 2009-221900

(51) Int. Cl.
*G01R 29/00* (2006.01)
*G01R 31/30* (2006.01)
*G01R 19/00* (2006.01)
*G01R 21/00* (2006.01)

(52) U.S. Cl.
CPC ........ *G01R 31/3016* (2013.01); *G01R 19/0084* (2013.01); *G01R 19/0092* (2013.01); *G01R 21/00* (2013.01)

(58) Field of Classification Search
CPC ............... G01R 19/0092; G01R 21/00; G01R 19/0084; H01L 2924/00
USPC ...................................................... 324/76.11
See application file for complete search history.

(56) References Cited

U.S. PATENT DOCUMENTS

| 4,497,056 | A | * | 1/1985 | Sugamori | ...................... 714/736 |
| 4,504,749 | A | * | 3/1985 | Yoshida | .................... H03K 5/13 327/276 |
| 5,083,299 | A | * | 1/1992 | Schwanke | ........ G01R 31/31937 324/73.1 |
| 5,351,211 | A | * | 9/1994 | Higeta | ...................... G11C 7/22 365/189.05 |
| 5,430,394 | A | * | 7/1995 | McMinn | ................. G01R 31/30 324/527 |
| 5,570,294 | A | * | 10/1996 | McMinn | ............ G01R 31/3016 324/527 |
| 6,002,282 | A | * | 12/1999 | Alfke | ............................ 327/165 |
| 6,057,691 | A | * | 5/2000 | Kobayashi | ......... G01R 31/3016 324/617 |
| 6,466,520 | B1 | * | 10/2002 | Speyer | .................... G01R 27/04 324/617 |
| 6,611,477 | B1 | * | 8/2003 | Speyer | .................... G01R 27/04 324/617 |
| 7,636,001 | B2 | * | 12/2009 | Kumata | ............... G11C 7/1066 327/149 |
| 2005/0036578 | A1 | * | 2/2005 | Heidel | ............... G01R 31/3016 375/371 |
| 2007/0091701 | A1 | | 4/2007 | Sakai | |
| 2007/0194824 | A1 | * | 8/2007 | Kumata | ............... G11C 7/1066 327/158 |
| 2008/0284477 | A1 | * | 11/2008 | Heidel | ............... G01R 31/3016 327/160 |
| 2009/0051396 | A1 | * | 2/2009 | Shimamoto | ............ G01R 29/26 327/153 |

FOREIGN PATENT DOCUMENTS

JP 2000-180514 A 6/2000

\* cited by examiner

*Primary Examiner* — Jermele M Hollington
*Assistant Examiner* — Christopher McAndrew
(74) *Attorney, Agent, or Firm* — Miles & Stockbridge P.C.

(57) ABSTRACT

There is provided a semiconductor integrated circuit in which a ring oscillator is formed by a variable delay circuit to cause the ring oscillator to oscillate (S2) at the test operation of the variable delay circuit and it is determined whether the variable delay circuit is normal or abnormal depending on whether the ring oscillator satisfies a predetermined monotonic increase condition (S6) and a predetermined linearity condition (S7).

5 Claims, 10 Drawing Sheets

FIG. 11

SEMICONDUCTOR INTEGRATED CIRCUIT

CLAIM OF PRIORITY

The present application claims priority from Japanese patent application JP 2009-221900 filed on Sep. 28, 2009, the content of which is hereby incorporated by reference into this application.

FIELD OF THE INVENTION

The present invention relates to a test circuit (a Built In Self-Test circuit, abbreviated to a BIST circuit) for evaluating a variable delay circuit and a delay control circuit integrated in a semiconductor device.

BACKGROUND OF THE INVENTION

A timing generator LSI for supplying a clock signal to an LSI tester is provided with a variable delay circuit and outputs a clock signal with a phase according to a test timing. Since a timing generator circuit is equipped with a plurality of variable delay circuits to sufficiently ensure the accuracy and the variable delay range of a clock signal to be output therefrom, the timing generator circuit is a complicated one. The delay control circuit can perform a small current control by using a digital-to-analog conversion circuit (hereinafter referred to as DAC) to improve the accuracy of delay and save electricity. An increase in degree of integration also increases the number of variable delay circuits which can be mounted on one LSI. Accordingly, the number of variable delay circuits mounted on one timing generator LSI reaches about several hundreds.

A ring oscillator is formed of variable delay circuits to measure its oscillation frequency, ensuring the operation of circuits in such a timing generator LSI. JP-A-2000-180514 discusses an example in which, although the document has its purpose to calibrate the phase of an output clock signal, a signal output to the terminal of a signal transmission route is fed back to the starting end thereof to form a closed loop oscillation circuit, which is used to adjust timing.

US2007/0091701 discloses a test method using the DAC. US2007/0091701 discusses that the operation confirmation of a transistor for controlling the current path of the DAC is performed by a functional test; however, the output current and voltage are outputted to an external tester.

SUMMARY OF THE INVENTION

Almost all of test time for a delay circuit is spent for measurement by a frequency counter. The time required for the test depends on accuracy and oscillation frequency. Measurement time is on the order of several milliseconds to several seconds per circuit. The test time increases in proportion to measurement accuracy, the number of variable delay circuits to be measured, and the number of combinations of delay adjustment parameters. As described above in "BACKGROUND OF THE INVENTION," these factors are being increased. On the other hand, pins for test are increased in number to increase in the speed of input and output between a tester and an LSI, allowing reducing the test time, however, the number of pins allocated to the test is limited, which cannot really suppress an increase in the time required for the test.

According to one aspect of the present invention, there is provided a semiconductor integrated circuit includes: a variable delay circuit; and a test circuit for the variable delay circuit; wherein the test circuit forms a ring oscillator using the variable delay circuit, causes the ring oscillator to oscillate at the time of test operation and determines whether the variable delay circuit is normal or abnormal depending on whether the ring oscillator satisfies predetermined monotonic increase and linearity conditions.

According to another aspect of the present invention, there is provided a semiconductor integrated circuit includes: a variable delay circuit; a delay control circuit including a digital analog conversion circuit configured to convert a digital signal to the amount of current and controlling the delay of the variable delay circuit by voltage according to the amount of current; and a test circuit for the delay control circuit; wherein the delay control circuit includes a plurality of unit current sources selected according to the value of a digital signal and the test circuit functionally and digitally determines that the value of a current flowing into each of the plurality of the unit current sources falls within a predetermined range to determine whether the delay control circuit is normal or abnormal.

The time required for the test of the variable delay circuit and the analog characteristic of the DAC is reduced.

DETAILED DESCRIPTION OF THE PREFERRED EMBODIMENTS

First Embodiment

The test circuit and the test method of the variable delay circuit are described below as a first embodiment.

Figure 1:
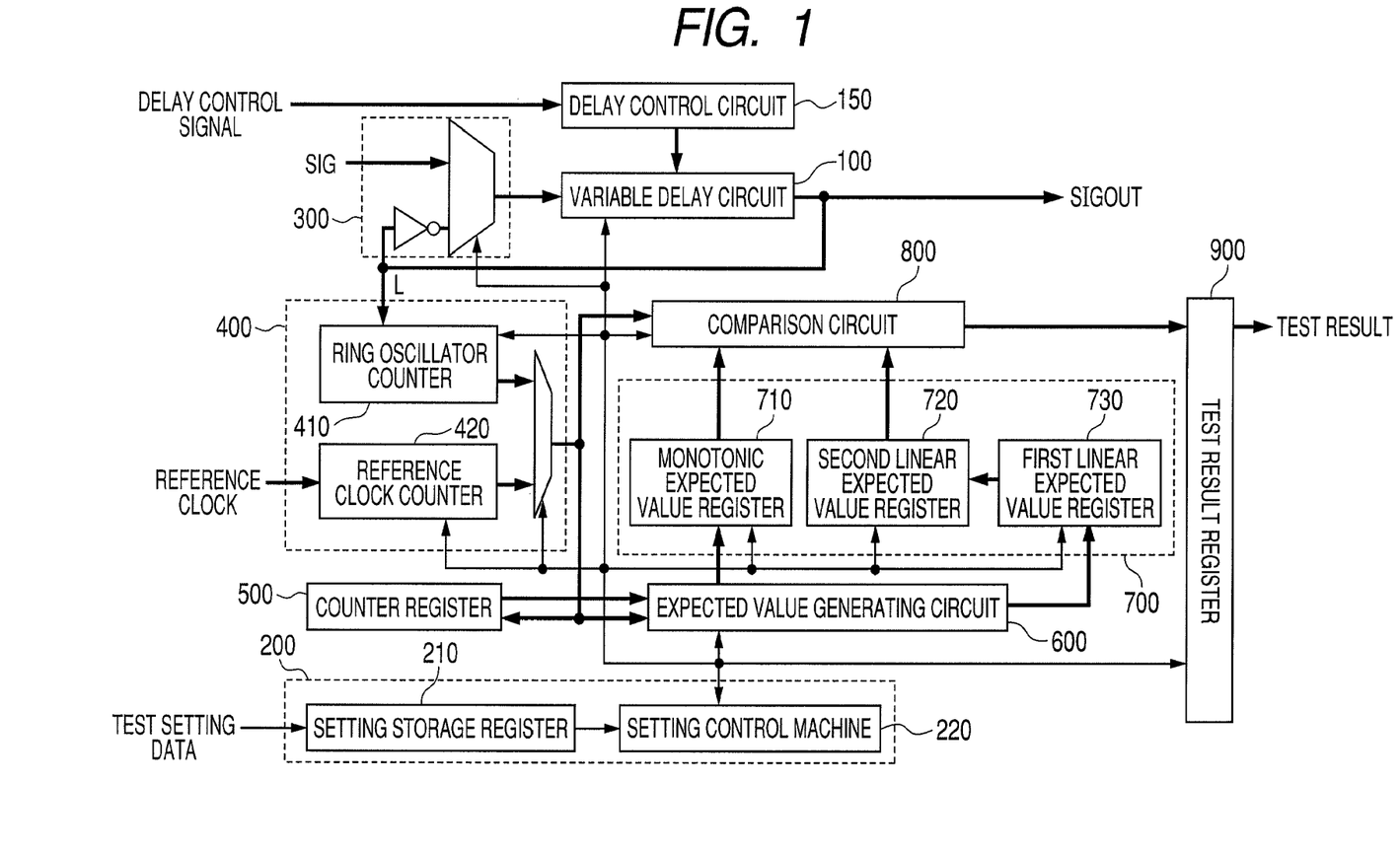
FIG. 1 is a block diagram of a variable delay circuit and a delay test circuit therefor.

FIG. 1 shows a block diagram of a variable delay circuit 100 to be measured and a delay test circuit therefor. The variable delay circuit 100 delays an input signal by a delay according to a control signal from a delay control circuit 150. The blocks excluding the variable delay circuit 100 are referred to as the delay test circuit and include a state machine 200, a test switching circuit 300, a frequency measurement circuit 400, a frequency counter register 500, an expected value generating circuit 600, an expected value register 700, a comparison circuit 800, and a test result register 900.

In a normal operation mode, the test switching circuit 300 selects a clock signal SIG. The delay control circuit 150 receives a delay control signal to adjust a delay control parameter. The variable delay circuit 100 delays the clock signal SIG input from delay control circuit 150 according to a change in the delay control parameter and outputs the delayed clock signal SIGOUT.

The flow on the whole of the test is described later with reference to FIG. 2. The function and the operation of each block are described below.

A test setting signal is inputted into the state machine 200. The state machine 200 includes a setting storage register 210 and a setting control machine 220. Test setting data is scanned in the setting storage register 210 from the outside. The setting control machine 220 receives setting data from the setting storage register 210 and controls the delay test circuit.

The test switching circuit 300 is controlled by the setting control machine 220 and selects a loop path L passing through the variable delay circuit 100 at the time of starting the test, thereby forming a ring oscillator.

The frequency measurement circuit 400 includes a ring oscillator counter 410 and a reference clock counter 420. The ring oscillator counter 410 counts the number of times of oscillation of the ring oscillator when the test switching circuit 300 forms the ring oscillator. The reference clock counter 420 counts the number of times of oscillation of a reference clock. When the count value of the reference clock counter 420 reaches a setting value given by the setting control machine 220, the reference clock counter 420 stops counting and stores the count value. At the same time, the count of the ring oscillator is ended.

The test of the variable delay circuit 100 is conducted using the count value of the ring oscillator counter 410 obtained when the count value of the reference clock counter 420 reaches the predetermined setting value. Hereinafter, the count value of the ring oscillator counter 410 is represented by $C_N$ at the time (represented by time $P_N$) when the reference clock counter 420 reaches N-th predetermined setting value after the test starts. The counter register 500 stores the count value of the ring oscillator counter 410, i.e., $C_{N-1}$ at the time (represented by time $P_{N-1}$) when the reference clock counter 420 reaches (N−1)th predetermined setting value.

The expected value generating circuit 600 uses the count value ($C_N$) of the ring oscillator counter 410 and the count value ($C_{N-1}$) of the counter register 500 to generate an expected value at the time of test.

The expected value register 700 includes a monotonic expected value register 710, a first linear expected value register 730, and a second linear expected value register 720. The monotonic expected value register 710 reads the count value stored in the counter register 500 and stores it. The first linear expected value register 730 stores the expected value $E_{N+1}$, $L_{uN+1}$, and $L_{1N+1}$) generated in the expected value generating circuit 600. The second linear expected value register 720 reads an expected value ($E_N$, $L_{uN}$, and $L_{1N}$) being earlier by one period than the expected value ($E_{N+1}$, $L_{uN+1}$, and $L_{1N+1}$) from the first linear expected value register 730 and stores the expected value ($E_N$, $L_{uN}$, and $L_{1N}$).

The comparison circuit 800 compares the count value stored in the ring oscillator counter 410 with the expected value stored in the monotonic expected value register 710 and the second linear expected value register 720.

The test result register 900 stores the comparison result from the comparison circuit 800.

Figure 2:
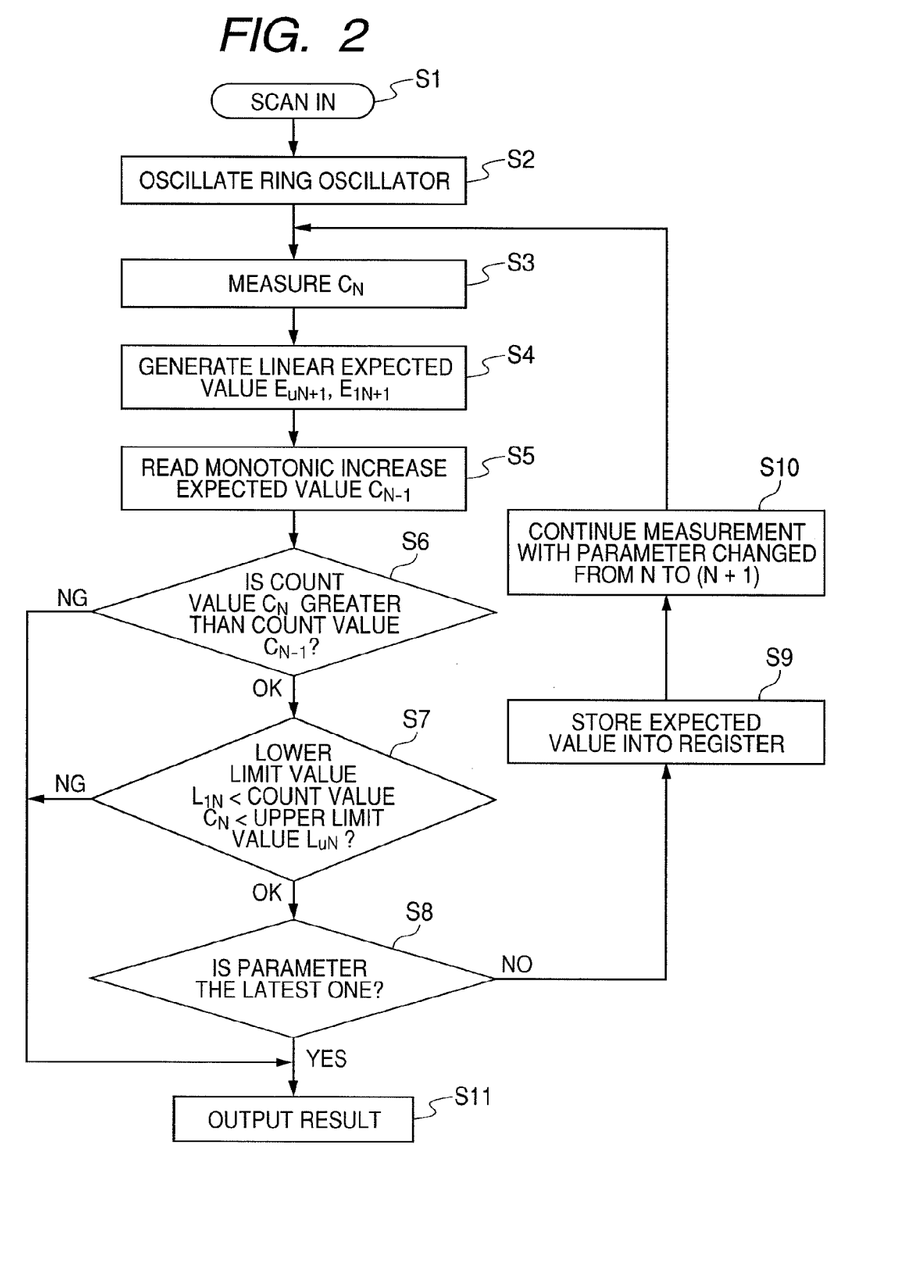
FIG. 2 is a flow chart of a test using FIG. 1.

FIG. 2 is an example of the flow of a delay time test conducted in the circuit shown in FIG. 1. The monotonic increase and linearity of delay of the variable delay circuit 100 are confirmed. The test of the variable delay circuit 100 is narrowed to the evaluation of monotonic increase and linearity to allow incorporating the expected value generating circuit and a determination circuit into the LSI.

In step S1, the external tester writes test setting data into the setting storage register 210. The setting control machine 220 reads the setting data from the setting storage register 210 to execute the control in step S2 and the subsequent steps.

In step S2, the test switching circuit 300 selects the loop path L to form the ring oscillator including the variable delay circuit 100 and causes the ring oscillator to oscillate.

In step S3, the ring oscillator counter 410 and the reference clock counter 420 start measuring count. When the count value of the reference clock counter 420 reaches the setting value provided by the setting control machine 220, the reference clock counter 420 outputs a count stop signal to the setting control machine 220. The setting control machine 220 receives the count stop signal and outputs the count stop signal to the ring oscillator counter 410 to stop the ring oscillator from counting. The count value $C_N$ is stored in the ring oscillator counter 410 and measurement is ended.

In step S4, the expected value generating circuit 600 reads the count value $C_N$ stored in the ring oscillator counter 410 and the count value $C_{N-1}$ stored in the counter register 500, generates the linear expected value $E_{N+1}$ and defines a linearity determination range.

Figure 3:
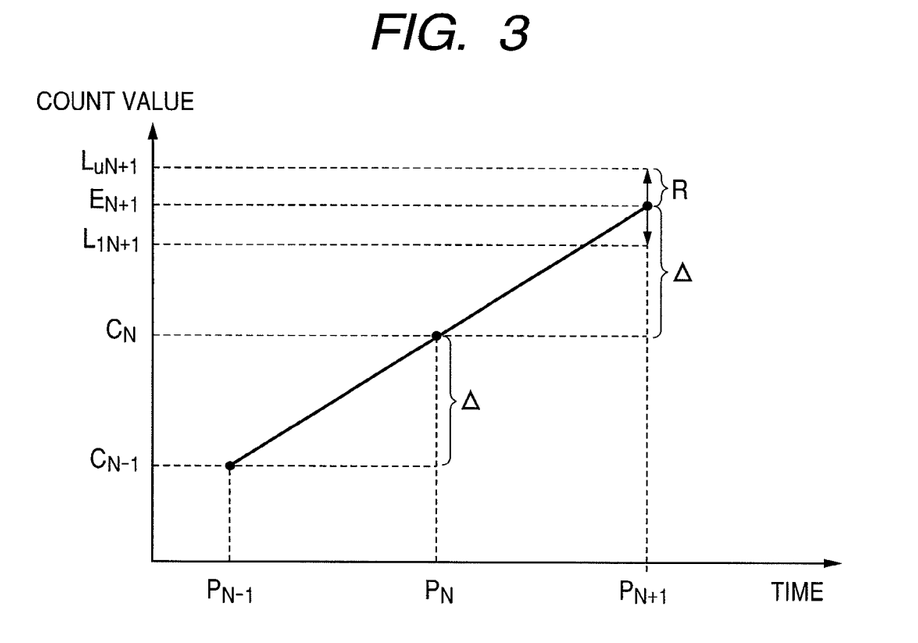
FIG. 3 is a schematic diagram for a linearity evaluation determination of the variable delay circuit.

FIG. 3 shows a schematic diagram for a linearity evaluation determination. In FIG. 3, the abscissa denotes time and the ordinate denotes the count value of the ring oscillator counter 410. If the difference between the count values $C_N$ and $C_{N-1}$ is take as $\Delta$, the expected value $E_{N+1}$ of the count value at the time $P_{N-1}$ can be represented by $C_N+\Delta$. The linearity determination range within which the output of the variable delay circuit 100 at the time $P_{N+1}$ is regarded as satisfying linearity is expressed by the following equations using a linearity allowance range R provided by the setting control machine 220:

$$L_{uN+1}=E_{N+1}+R$$

$$L_{1N+1}=E_{N+1}-R$$

where $L_{uN+1}$ is the upper limit value of the linearity determination range at the time $P_{N+1}$ and $L_{1N+1}$ is the lower limit value thereof. The values are stored in the first linear expected value register 730.

In step S5, the count value $C_{N-1}$ stored in the counter register 500 is read into the monotonic expected value register 710 and taken as an expected value to be used for monotonic evaluation.

In step S6, the comparison circuit 800 compares the count value $C_{N-1}$ stored in the monotonic expected value register 710 with the count value $C_N$ stored in the ring oscillator counter 410. If $C_{N-1}<C_N$, it is determined that the count value $C_N$ monotonically increases. After the comparison is ended, the test result is stored in the test result register 900. If it is determined that the count value $C_N$ monotonically increases, the proceeding proceeds to the following step for linearity evaluation. If it is determined that the count value $C_N$ does not monotonically increase, the result is outputted and the processing is ended (step S11).

In step S7, the comparison circuit 800 reads the upper limit value $L_{uN}$ and the lower limit value $L_{1N}$ of the linearity determination range stored in the second linear expected value register 720 and the count value $C_N$ stored in the ring oscillator counter 410 and if $L_{1N}<C_N<L_{uN}$, it is determined that the count value $C_N$ is within a prescribed linearity range. If the linearity comparison is satisfied, it is confirmed whether the parameter is the latest one. If it is confirmed that the parameter is not the latest one, the result is outputted and the proceeding is ended (step S11).

In step S8, if the control parameter is the latest one, the result is outputted and the proceeding is ended (step S11). If the control parameter is not the latest one, the count value $C_N$ stored in the ring oscillator counter 410 is stored in the counter register 500. The expected value ($E_{N+1}$, $L_{uN+1}$, and $L_{1N+1}$) stored in the first linear expected value register 730 is stored in the second linear expected value register 720 (step S9). After storage, the time parameter is changed from N to (N+1) in step S10, and measurement is continued.

Figure 4:
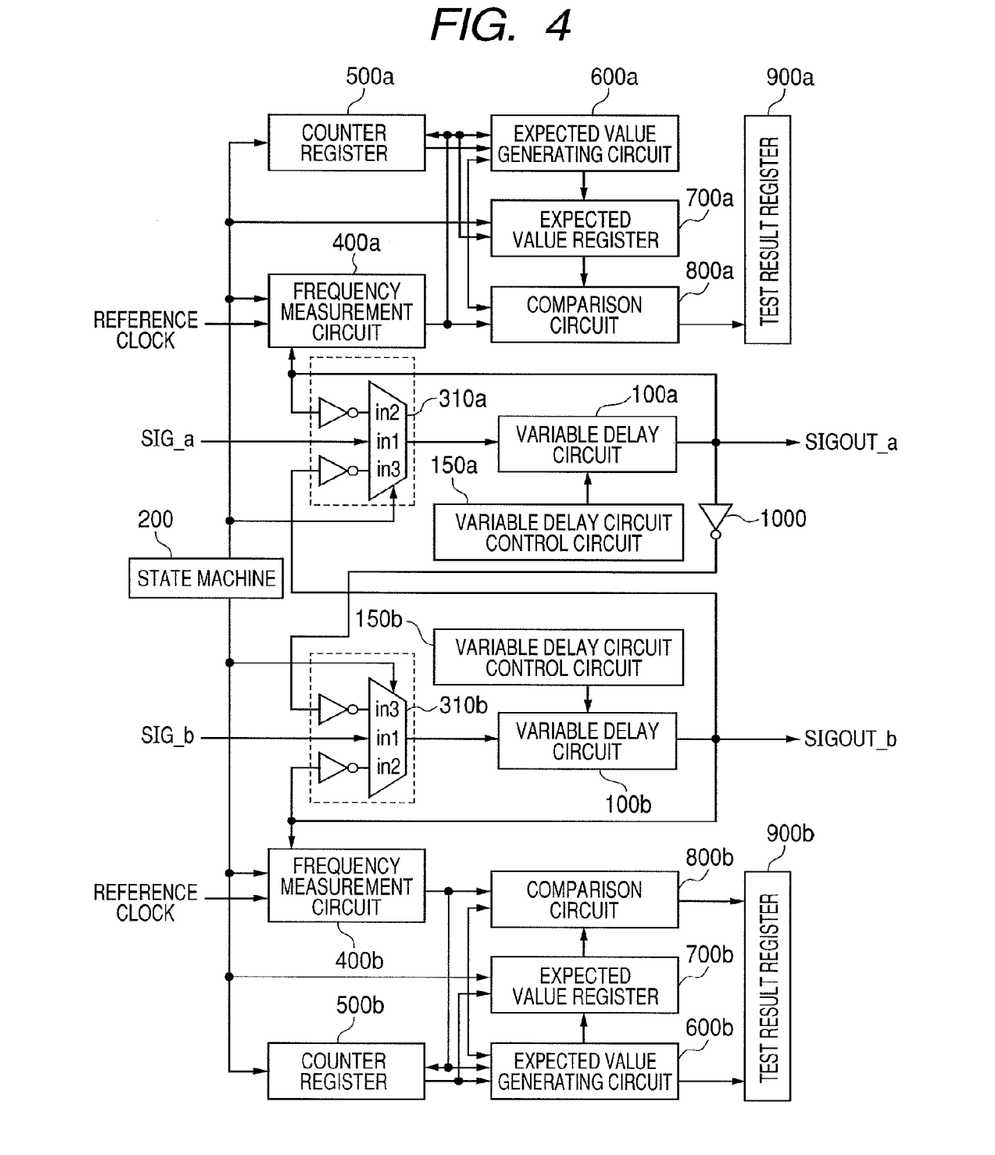
FIG. 4 is a block diagram of the delay test circuit applied to a plurality of the variable delay circuits.

FIG. 4 shows an example of configuration of a plurality of the variable delay circuits 100. The blocks being common in function to those in FIG. 1 are denoted by the same reference characters and numerals. FIG. 4 has two variable delay circuits. The blocks and the signals related to a first variable delay circuit 100a are provided with a subscript "a" and the blocks and the signals related to a second variable delay circuit 100b are provided with a subscript "b," the detailed description thereof is omitted. Thus, a test switching circuit 310 corresponding to the variable delay circuit, a frequency measurement circuit 400 and the like are prepared for the plurality of the variable delay circuits 100 to allow simultaneous test of a plurality of the variable delay circuits. Thereby, testing time can be reduced.

In the configuration of FIG. 4, an inverter 1000 is put between a first variable delay circuit 100a and a second variable delay circuit 100b to couple them together, thereby allowing forming a ring oscillator using two variable delay circuits. The selector of the test switching circuit 310 switches three inputs. In a normal operation mode, the clock signal SIG input to an input in1 is inputted. If a plurality of the variable delay circuits is separately tested, the selector selects an input in2. In this case, each of the variable delay circuits is tested as is the case with the example in FIG. 1. When the selector selects an input in3, a loop path of the variable delay circuit 100a, the inverter 1000, the test switching circuit 310b, the variable delay circuit 100b, and the test switching circuit 310a is formed to form a ring oscillator using two variable delay circuits 100a and 100b.

A small delay of the variable delay circuit increases the oscillation frequency of the ring oscillator, which makes it difficult to conduct a test. As shown in FIG. 4, the ring oscillator is formed by a plurality of the variable delay circuits to suppress the increase of the oscillation frequency of the ring oscillator even if an individual variable delay circuit is small in delay, increasing the accuracy of a test. Furthermore, the delays of the first and the second variable delay circuit are complementarily changed to make constant the oscillation frequency of the coupled ring oscillator, enabling the influence of frequency dependency to be eliminated, which allows further increasing test accuracy.

Second Embodiment

In the second embodiment, the test circuit and the test method of the delay control circuit 150 are described below. In a configuration in FIG. 5, delay is controlled by the DAC. A control DAC 2100 has a plurality of unit current sources M1 to M3. The control. DAC 2100 performs switching between conduction and non-conduction of transistors M4 to M6 using control signals DC1 to DC3. Current $I_D$ flowing according to a control DAC control signal DC is current/voltage converted by a mirror circuit MR1 and a voltage according to the current $I_D$ is applied to the variable delay circuit 100 to control the delay. It is needless to say that the number of unit current sources of the control DAC 2100 is not limited to three. The gate width W of each of the unit current sources M1 to M3 may be adjusted to make the current $I_D$ multiple. In the present embodiment, it is tested whether all bits in the control DAC 2100 normally operate using the output current of the control DAC. "All bits normally operate" means that both of the following are satisfied: conduction and non-conduction of the transistors M4 to M6 are normally performed; and current flowing into the unit current sources M1 to M3 falls within a design value.

Thus, a test for each unit current source is conducted instead of conducting a test for all variable delay parameters in the delay control circuit to allow reducing the number of tests from the number of all variable delay parameters to the number of unit current sources in the delay control circuit, enabling the test time to be reduced. Since the magnitude relation between the amounts of current in the unit current sources can be directly tested with respect to a change in delay in the variable delay circuit, measurement accuracy can be improved.

Figure 5:
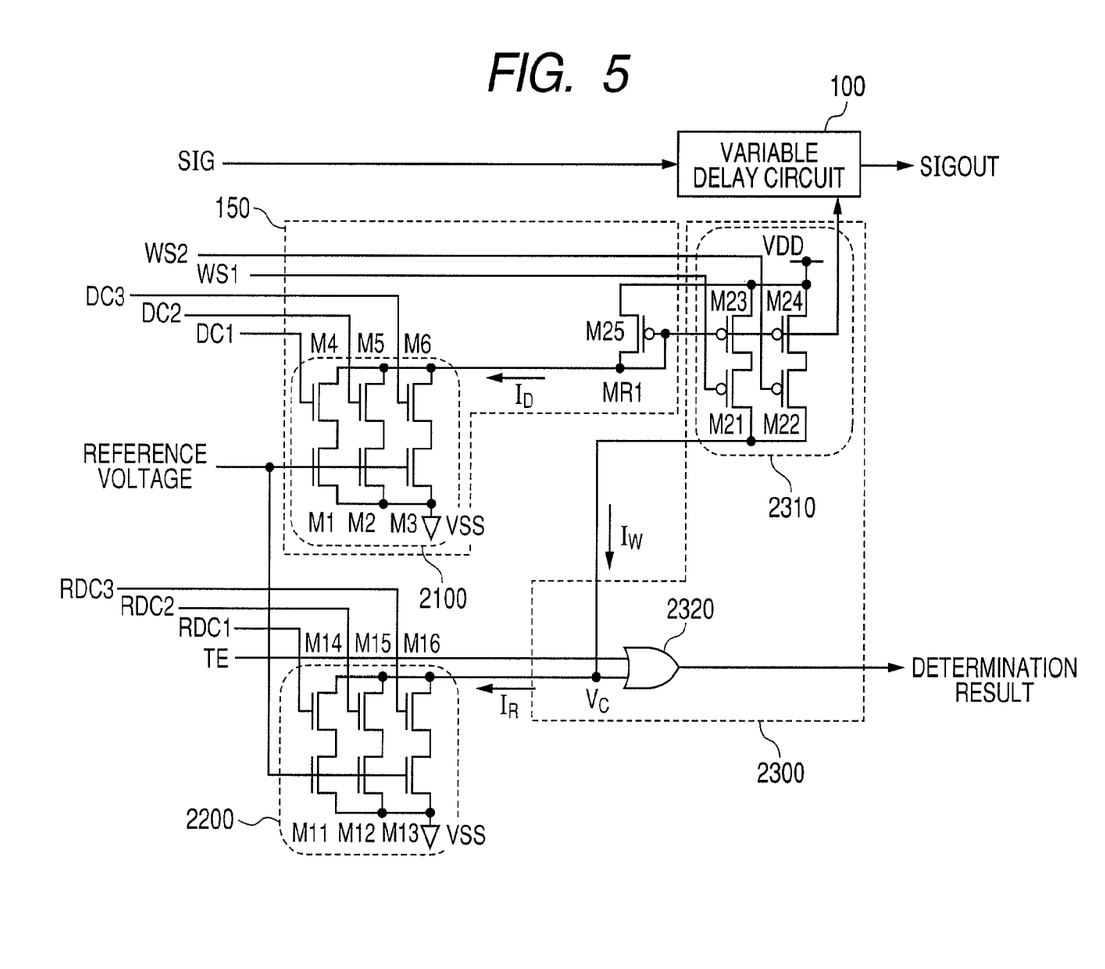
FIG. 5 is a block diagram of a delay control circuit and a test circuit therefor.

A test circuit for the delay control circuit 150 is formed of a replica DAC 2200 and a window comparator 2300.

The replica DAC 2200 also includes a plurality of unit current sources M11 to M13. Replica DAC control signals RDC1 to RDC3 perform switching between conduction and non-conduction of transistors M14 to M16. The common reference voltage is applied to the gates of the unit current sources of the control DAC 2100 and the replica DAC 2200. It is necessary only that the replica DAC 2200 can cause current $I_R$ required for the test for the control DAC 2100 to flow, so that the replica DAC 2200 does not always need to be similar in configuration to the control DAC 2100. Since the replica DAC 2200 is mounted in the same LSI, the replica DAC 2200 is desirably as small as possible to reduce overhead.

The window comparator 2300 includes a window width adjustment circuit 2310 and a determination circuit (an OR circuit in this example) 2320.

The window width adjustment circuit 2310 is controlled by window width setting signals WS1 and WS2. A current mirror circuit draws a current equivalent to the output current $I_D$ of the control DAC 2100 and transistors M21 and M22 the size of which is adjusted to the current adjust an output current $I_w$.

An example is shown below. Suppose that the current $I_D$ is mirrored on the source and drain path of the transistor M21 when the gate width of the transistor M21 is w. In this case, the gate width of the transistor M21 is taken as 0.8 w and the gate width of the transistor M22 is 0.4 w. At this point, both of the transistors M21 and M22 are caused to conduct to obtain the output current $I_w=1.2\ I_D$. The transistor M21 is caused to conduct and the transistor M22 is not caused to conduct to obtain the output current $I_w=0.8\ I_D$.

The determination circuit 2320 determines whether a current in which the output current of the control DAC 2100 is adjusted by the window width adjustment circuit 2310 is greater or smaller than the output current of the replica DAC 2200.

The window width setting signal WS, the control DAC control signal DC, the replica DAC control signal RDC, and a test enable TE are inputted from the outside (tester).

The determination principle of the window comparator 2300 is described below with reference to FIGS. 6 and 7 with the unit current source M1 of the control DAC 2100 as an example. When the transistor M4 is caused to conduct and the transistors M5 and M6 are caused not to conduct, it is supposed that the current $I_D$ (actual measured value) flows into the unit current source M1.

Figure 6:
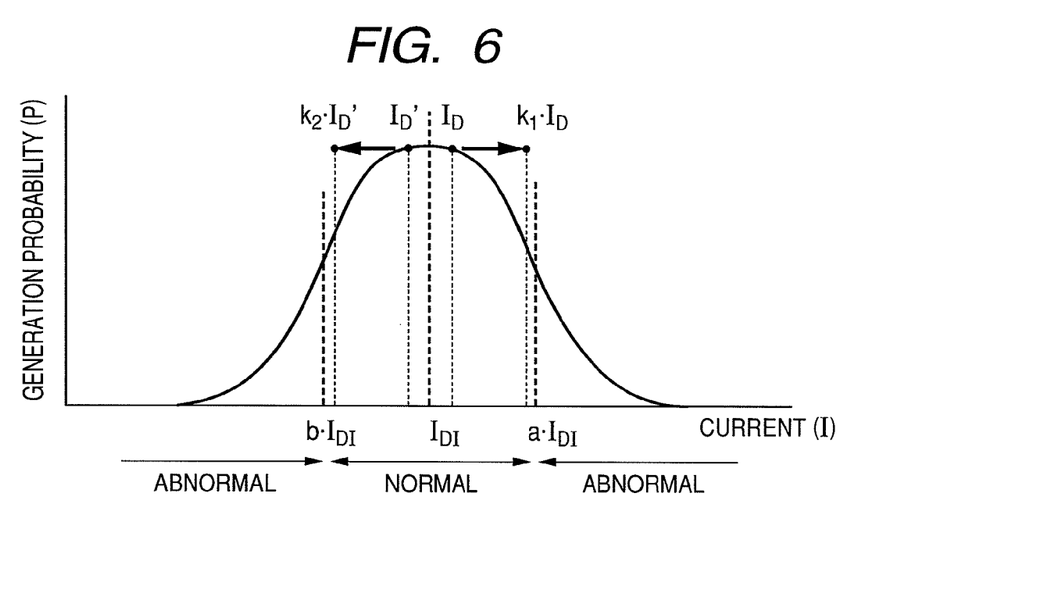
FIG. 6 is a diagram showing a generation probability of current flowing into a unit current source.

As shown in FIG. 6, the current $I_D$ flowing into the unit current source M1 disperses with a design value $I_{DI}$ as a center, so that if the actual measured value is within the range of the following formula (1), the unit current source M1 is regarded as being normally operated:

$$b \cdot I_{DI} < I_D \text{(actual measured value)} < a \cdot I_{DI} (a>1, 0<b<1) \quad (1)$$

In the configuration in FIG. 5, a determination is made as described below as to whether the current $I_D$ (actual measured value) falls within a predetermined normal range.

[Determination of Upper Limit]

As shown in FIG. 6, if the current $I_D$ is represented by the following formula (2):

$$k_1 \cdot I_D < a \cdot I_{DI} (a > k_1 > 1) \quad (2)$$

the upper limit is regarded as being satisfied. For the sake of simplicity of description, suppose that the output current $I_R$ of the replica DAC is equal to $I_{DI}$ (that is, $I_R = I_{DI}$). For example, the unit current source M1 of the control DAC and the unit current source M11 of the replica DAC are produced by transistors with the same size to satisfy the supposition. Therefore, the formula (2) can be replaced by the following formula (3):

$$k_1 \cdot I_D < a \cdot I_R (a > k_1 > 1) \quad (3).$$

The formula (3) is transformed to the following formula (4):

$$(k_1/a) \cdot I_D = K_1 \cdot I_D < I_R (K_1 < 1) \quad (4).$$

For this reason, if the parameter of the window width adjustment circuit 2310 is the output current $I_w = K_1 \cdot I_D$, $$I_w < I_R \quad (5),$$

when the relationship represented by of the formula (5) is satisfied, it can be determined that the upper limit is satisfied.

[Determination of Lower Limit]

As shown in FIG. 6, suppose that the following formula (6) satisfies the upper limit:

$$B \cdot I_{DI} < k_2 \cdot I_D' (1 > k_2 > b > 0) \quad (6).$$

Similarly, if it is supposed that the output current $I_R$ of the replica DAC is equal to $I_{DI}$ (that is, $I_R = I_{DI}$), the formula (6) can be replaced by the following formula (7):

$$b \cdot I_R < k_2 \cdot I_D' (1 > k_2 > b > 0) \quad (7).$$

The formula (7) is transformed to the following formula (8):

$$I_R < (k_2/b) \cdot I_D' = K_2 \cdot I_D' (K_2 > 1) \quad (8).$$

For this reason, if the parameter of the window width adjustment circuit 2310 is the output current $I_w' = K_2 \cdot I_D'$, $$I_R < I_w' \quad (9)$$

when the relationship represented by the formula (9) is satisfied, it can be determined that the lower limit is satisfied.

Figure 7:
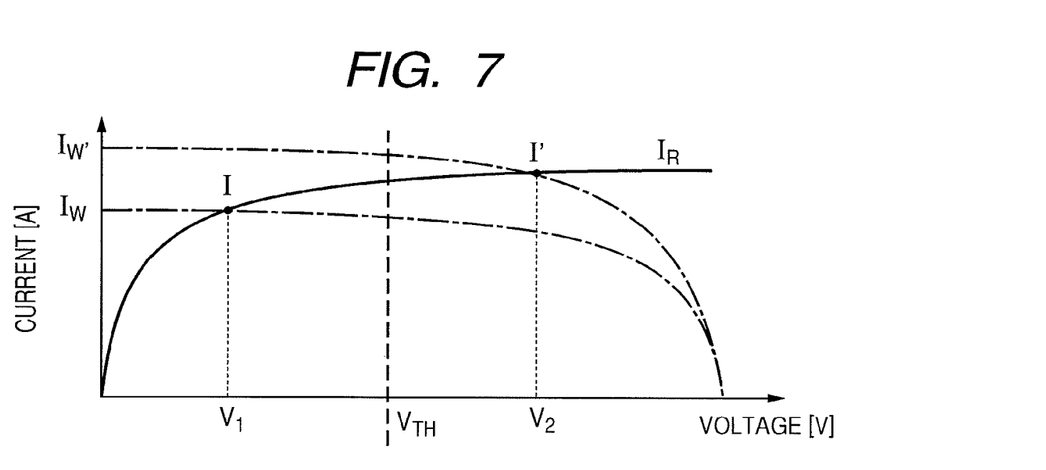
FIG. 7 is a diagram showing a relationship among current, voltage, and determination output in a window comparator.

FIG. 7 shows the relationship between current and voltage in the window comparator 2300. In the determination of the upper limit, the current $I_w$ adjusted so that the output current $I_D$ of the control DAC 2100 is reduced by the window width adjustment circuit 2310 and the output current $I_R$ of the replica DAC 2200 is in an equilibrium state at the current I. The voltage at a node Vc at this point is taken as $V_1$. In the determination of the lower limit, the current $I_w'$ adjusted so that the output current $I_D'$ of the control DAC 2100 is increased by the window width adjustment circuit 2310 and the output current $I_R$ of the replica DAC 2200 is in an equilibrium state at the current I'. The voltage at a node Vc at this point is taken as $V_2$.

The window comparator 2300 determines whether the output current $I_R$ of the replica DAC and the currents $I_w$ and $I_w'$ corresponding to the upper and the lower limit respectively have the relationship shown in FIG. 7. The OR circuit in the determination circuit 2300 functions as an inverter if the test enable TE is Low and compares the voltage appearing at the node Vc with a logic threshold voltage $V_{TH}$ of the OR circuit. If the currents $I_R$, $I_w$, and $I_w'$ have the relationship shown in FIG. 7, in the determination of the upper limit, the node $Vc = V_1 < V_{TH}$, so that the determination result becomes "Low." In the determination of the lower limit, the node $Vc = V_2 > V_{TH}$, so that the determination result becomes "High." If the above determination results appear in the determination of the upper and the lower limit, it is determined that the unit current source M1 of the control DAC 2100 is normally operated. At this point, the determination of the unit current source M1 is completed and then the determination of the unit current source M2 is started. Thus, the test of the control DAC is digitally determined to produce an effect in which a logic test of a general LSI test and an interface can be made common.

Figure 8:
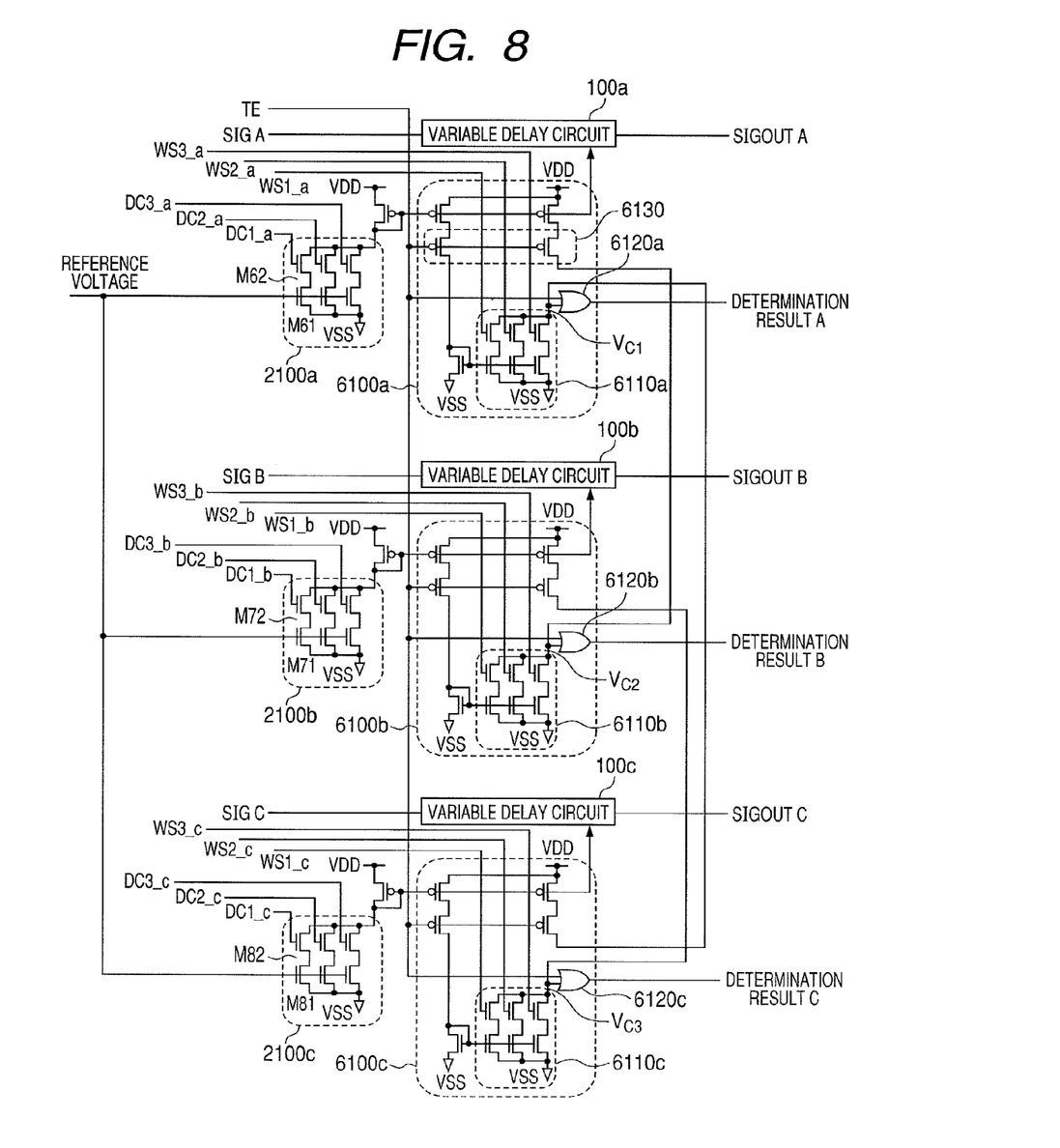
FIG. 8 is a circuit diagram in which the same control DAC is used as a replica DAC.

FIG. 8 shows an example of a configuration in which the control DAC of the delay control circuit existing in the same LSI is used as a replica DAC of a different delay control circuit. In the example of FIG. 8, a control DAC 2100b for a variable delay circuit 100b is used as a replica DAC for a control DAC 2100a. A control DAC 2100c for a variable delay circuit 100c is used as a replica DAC for a control DAC 2100b. A control DAC 2100a for a variable delay circuit 100a is used as a replica DAC for a control DAC 2100c. The control DACs 2100 are similar in configuration to each other. A window comparator 6100 includes a window width adjustment circuit 6110, a determination circuit 6120, and a switch circuit 6130. Although the window width adjustment circuit 6110 is different in polarity from the window width adjustment circuit shown in FIG. 5, the window width adjustment circuit 6110 functions similarly therewith. In a test operation mode (the test enable TE is low), the switch circuit 6130 conducts to operate the window width adjustment circuit 6110. In a normal operation mode (the test enable TE is high), the switch circuit 6130 does not conduct, causing the window width adjustment circuit 6110 not to operate.

The unit current source of the control DAC 2100a is tested such that the electric potential at the node $V_{c1}$ determined by the amount of current in which the current flowing into the control. DAC 2100a is adjusted for the upper/lower determination by the window width adjustment circuit 6110a and the amount of current flowing into the control DAC 2100c (the replica DAC) is determined by a determination circuit 6120a. The unit current source of the control DAC 2100b is tested such that the electric potential at the node $V_{c2}$ determined by the amount of current in which the current flowing into the control DAC 2100b is adjusted for the upper/lower determination by the window width adjustment circuit 6110b and the amount of current flowing into the control DAC 2100b (the replica DAC) is determined by a determination circuit 6120b. The unit current source of the control DAC 2100c is tested such that the electric potential at the node $V_{c3}$ determined by the amount of current in which the current flowing into the control DAC 2100c is adjusted for the upper/lower determination by the window width adjustment circuit 6110c and the amount of current flowing into the control DAC 2100b (the replica DAC) is determined by determination circuit 6120c. An example where unit current sources M61, M71, and M81 are tested is described below. Control signals DC3_a, DC3_b, and DC3_c are rendered to be high to cause the transistors M62, M72, and M82 to conduct. Other control signals DC1 and DC2 are rendered to be low to cause current to flow into the control DACs 2100a to 2100c according to the unit current sources M61, M71, and M81 respectively. Thus, the unit current source of the control DAC 2100 is tested.

Thus, the control DAC with the same configuration regarded as the replica DAC is used to allow preventing the area overhead of the test circuit from being increased. In the example of FIG. 8, although three control DACs are used, the present invention is not limited to this number.

Figure 9:
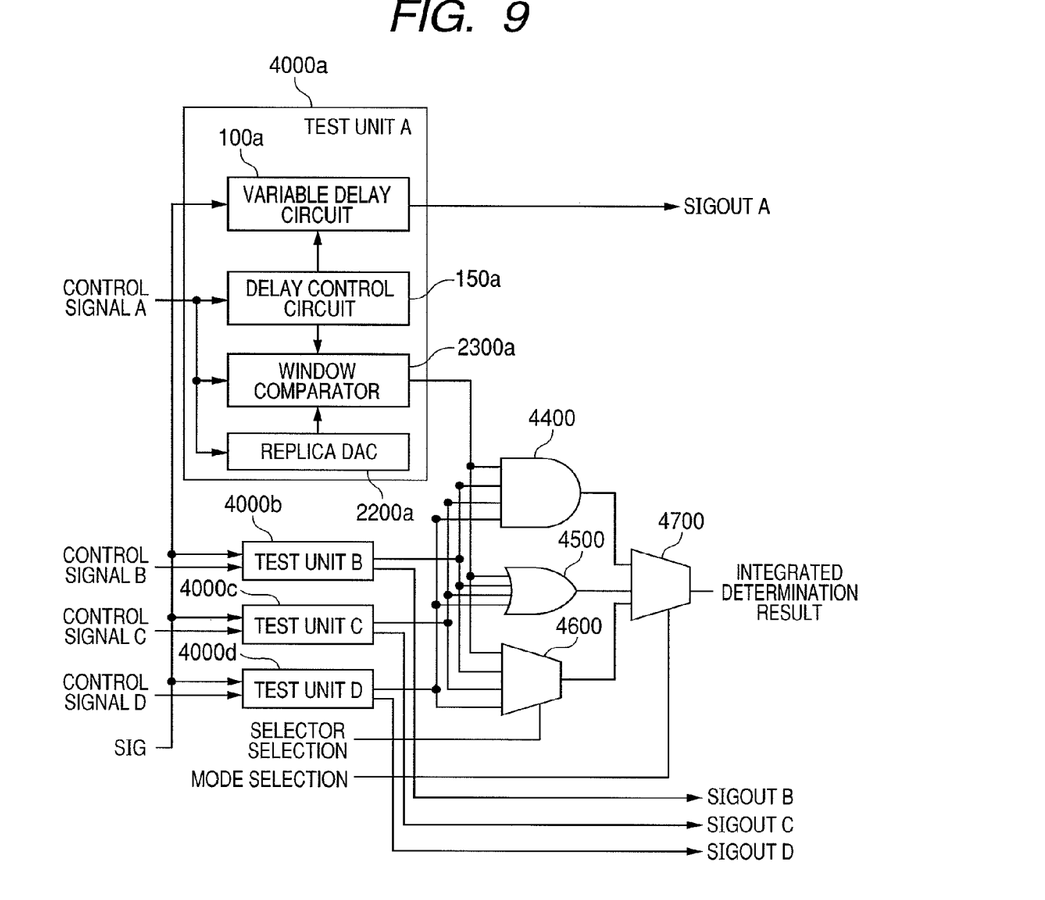
FIG. 9 is an example of a configuration in which test results are integrated and output.

FIG. 9 shows an example of a configuration in which the determination results of a plurality of the variable delay circuits are collectively output and determined. In FIG. 9, the delay control circuit 150 corresponding to one variable delay circuit 100 and the test circuits thereof are referred to as one test unit.

In this example, there are included an AND circuit 4400, an OR circuit 4500, and a selector 4600 to which determination results are inputted from the window comparators 2300 of a plurality of test units 4000 and a selector 4700 for selecting outputs of the AND circuit 4400, the OR circuit 4500, and the selector 4600.

As a description is made in relation to FIG. 7, the output of the window comparator 2300 being Low in the determination of the upper limit of the unit current source and the output of the window comparator 2300 being High in the determination of the lower limit of the unit current source are an expected value in a normal operation mode. In the determination of the upper limit of the unit current source, the selector 4700 selects the OR circuit 4500. If even one High output exists in the determination result from the test unit, the output result becomes High, so that it can be determined that the test unit deviating from the expected value exists. On the other hand, in the determination of the lower limit of the unit current source, the selector 4700 selects the AND circuit 4400. If even one Low output exists in the determination result from the test unit, the output result becomes Low, so that it can be determined that the test unit deviating from the expected value exists.

The selector 4600 is used when the determination result is separately output from each test unit as a debug mode if the integrated determination result is not obtained as expected from the selector 4700.

It is needless to say that the number of the test units is not limited to four. Each test unit may use the configuration shown in FIG. 5 or 8.

Figure 10:
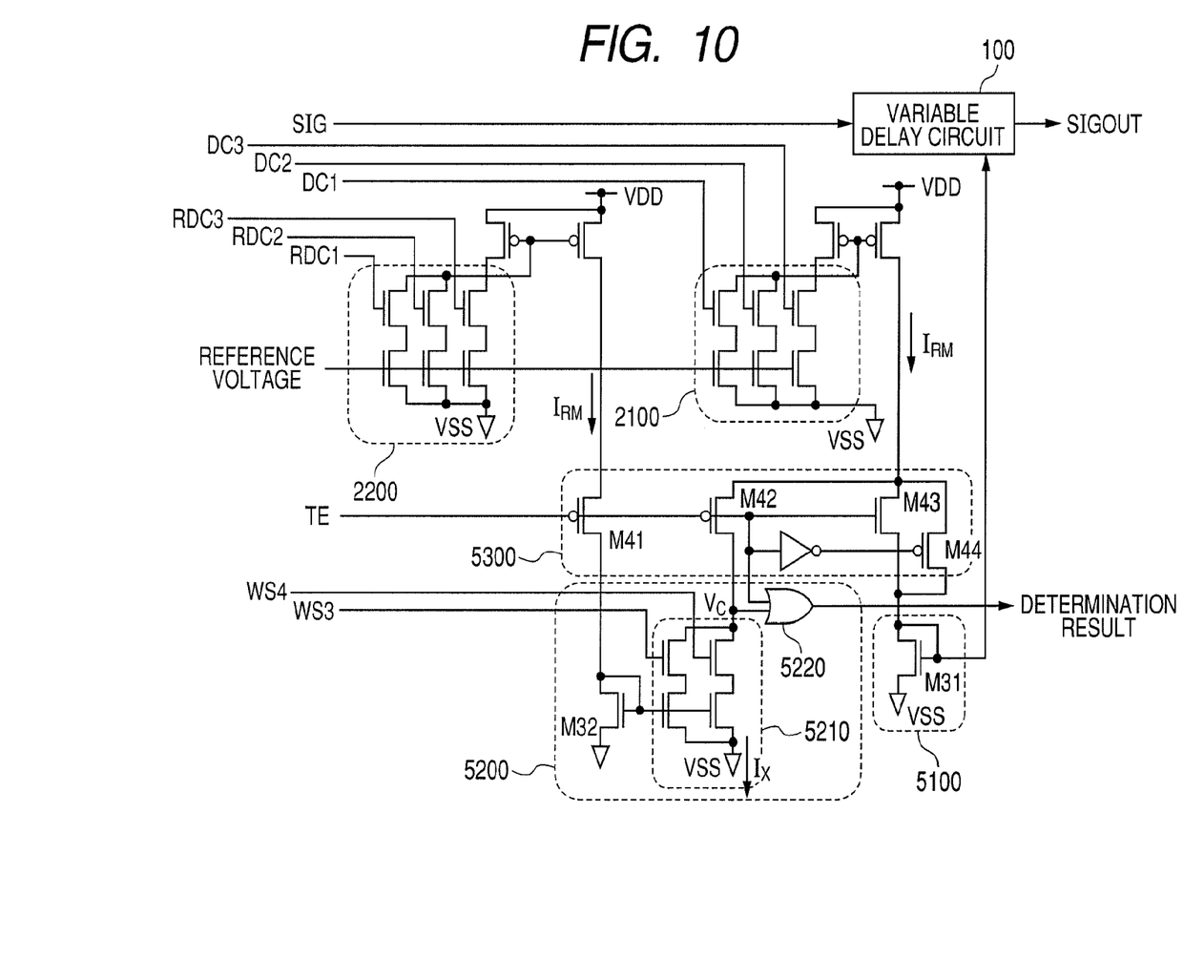
FIG. 10 is an example of a configuration in which a current switch is mounted.

FIG. 10 is an example of configuration for increasing a test accuracy, in which a current switch is used. A MOS transistor increases in a production dispersion along with the miniaturization thereof, which disperses the characteristics thereof. The influence of the dispersion can be reduced by increasing the gate length (Lg) of the MOS transistor. A transistor M31 forming a current source 5100 for supplying a control voltage to the variable delay circuit 100 in a normal operation mode is formed of a miniaturized MOS transistor matched to a transistor in the variable delay circuit 100. This is because a small change in current in a saturation area is desired to improve sensitivity at the time of comparing current. For this reason, the transistor M31 is configured with the gate length equal to that of the MOS transistor forming the variable delay circuit 100. In FIG. 5, the power supply NMOS (the transistors M11, M12, and M13 of the replica DAC 2200) and the power supply PMOS (the transistors M23, M24, and M25 of the window width adjustment circuit 2310) correspond to the above. On the other hand, a MOS transistor shows a great change in current in the saturation area along with the miniaturization thereof. It is desirable that a change in current in the saturation area is small as the MOS transistor of the window comparator 2300, which may worsen sensitivity. A current source M32 greater in size, that is to say, greater in a gate length (Lg) than the transistor M31 of a current source 5100 receiving the output of the control DAC used in the normal operation mode is used at the time of test to use the power supply excellent in characteristic, improving the determination accuracy of the determination circuit.

The configuration of FIG. 10 is different from that of FIG. 5 in that the output current of the replica DAC 2200 is switched between the upper limit determination and the lower limit determination by a window width adjustment circuit 5210. It can be determined whether the unit current source is normally operated based on the same principle as those of FIGS. 6 and 7.

In the example of the present configuration, a current switching circuit receiving the test enable TE is provided. In a normal operation mode, that is to say, in the case where the test enable TE is High, the transistors M43 and M44 conduct to output a delay control signal according to the delay control signal DC. On the other hand, the transistors M41 and M42 are caused not to conduct.

At the time of test, the test enable TE is rendered to be Low to cause the transistors M43 and M44 not to conduct and the transistors M41 and M42 to conduct. Thereby, the voltage at the node $V_c$ determined by the magnitude relation between the output current $I_x$ obtained by switching the mirror output current $I_{RM}$ of the replica DAC 2200 by the window width adjustment circuit 5210 and the mirror output current $I_{RM}$ of the control DAC 2100 is determined by the determination circuit 5220 and the determination result is outputted.

Figure 11:
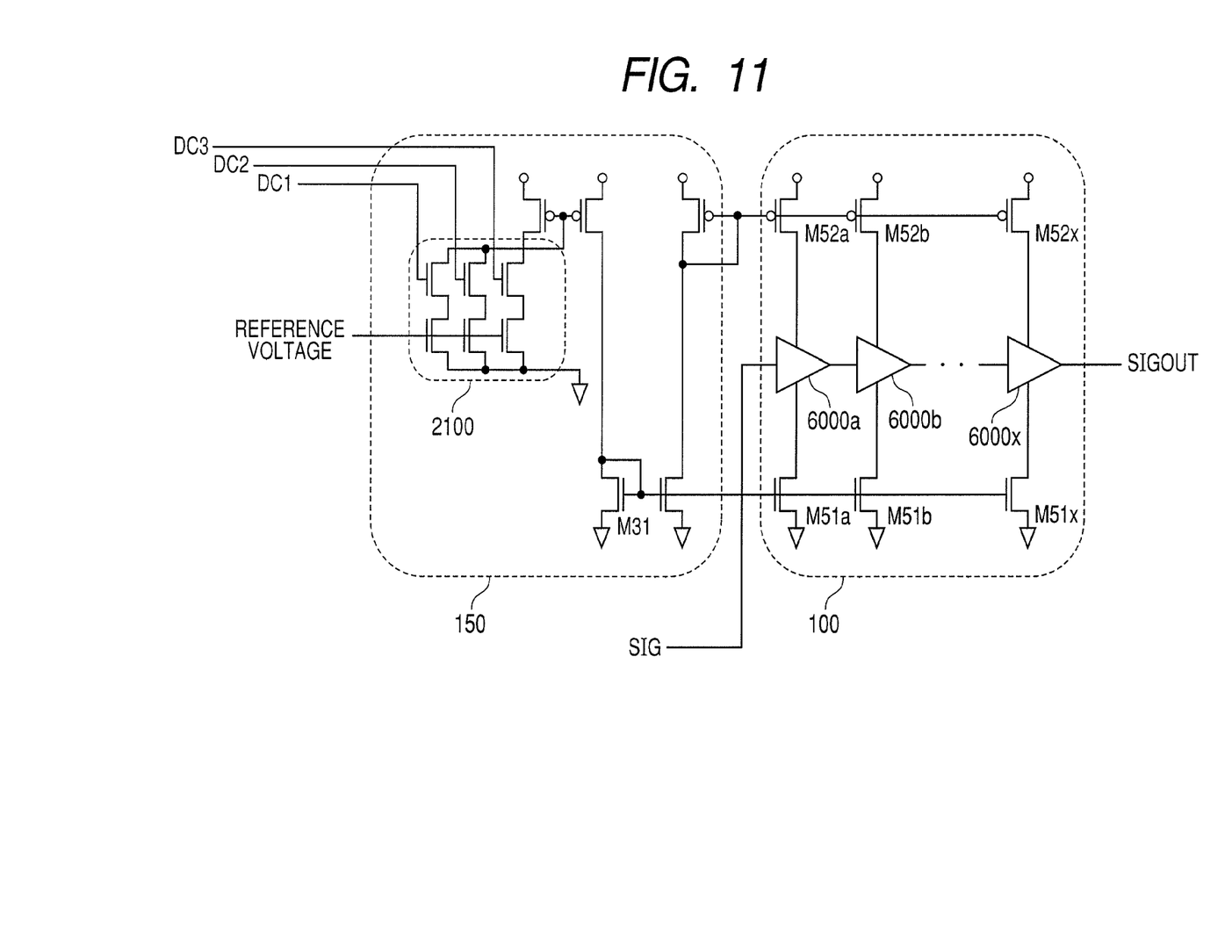
FIG. 11 is an example of a configuration of the variable delay circuit and the delay control circuit.

The invention made by the inventors is described above based on the embodiments. It is needless to say that the present invention is not limited to the embodiments and various changes may be made without departing from the sprit and scope of the present invention. FIG. 11 shows an example of configuration of the variable delay circuit 100 and the delay control circuit 150. The delay control circuit 150 controls the delay of the variable delay circuit 100 by controlling the ON resistance of the NMOS transistor M51 provided between the delay element 6000 and the reference electric potential and the PMOS transistor M52 provided between the delay element 6000 and the power supply electric potential.

The present invention is applicable not only to a circuit having either the variable delay circuit or the DAC, but to a circuit having both the variable delay circuit and the DAC. The output of the variable delay circuit may be output by fine adjusting the clock signal coarse adjusted by a first variable delay circuit by a second variable delay circuit instead of outputting the output of the variable delay circuit, as it is. It is to be understood that the DAC to which the test circuit described in the embodiments can be applied is not limited to the DAC used for the delay control circuit.

What is claimed is:

1. A semiconductor integrated circuit comprising:
  a first variable delay circuit;
  a first delay control circuit including a first digital analog conversion circuit configured to convert a digital signal to the amount of current and controlling the delay of the first variable delay circuit by voltage according to the amount of current; and
  a first test circuit for the first delay control circuit,
  wherein the first digital analog conversion circuit includes a plurality of unit current sources selected according to the value of a digital signal and the first test circuit determines that the value of a current flowing into each of the plurality of unit current sources falls within a predetermined range to determine whether the first delay control circuit is normal or abnormal,
  wherein the first test circuit includes a third digital analog conversion circuit configured to convert a digital signal to the amount of current and a current adjustment circuit configured to increase or decrease the amount of current of the first digital analog conversion circuit by a predetermined amount, and wherein the amount of current flowing into the third digital analog conversion circuit is compared with a first amount of current in which the amount of current flowing into the first digital analog conversion circuit is increased by the current adjustment circuit by a predetermined amount and a second amount of current in which the amount of current flowing into the first digital analog conversion circuit is decreased by the current adjustment circuit by a predetermined amount to determine whether the value of current flowing into the unit current source falls within a predetermined range.

2. The semiconductor integrated circuit according to claim 1, further comprising:
   a second variable delay circuit;
   a second delay control circuit including a second digital analog conversion circuit configured to convert a digital signal to the amount of current and controlling the delay of the second variable delay circuit by voltage according to the amount of current; and
   a second test circuit for the second delay control circuit;
   wherein the second digital analog conversion circuit includes a plurality of unit current sources selected according to the value of a digital signal and the second test circuit determines whether the value of a current flowing into each of the plurality of the unit current sources falls within a predetermined range to determine whether the second delay control circuit is normal or abnormal.

3. The semiconductor integrated circuit according to claim 2, wherein the determination results of the first and the second delay control circuit are outputted with the determination results integrated.

4. The semiconductor integrated circuit according to claim 2,
   wherein the first test circuit includes a current adjustment circuit configured to increase or decrease the amount of current of the second digital analog conversion circuit by a predetermined amount, and
   wherein the amount of current flowing into the first digital analog conversion circuit is compared with a first amount of current in which the amount of current flowing into the second digital analog conversion circuit is increased by the current adjustment circuit by a predetermined amount and a second amount of current in which the amount of current flowing into the second digital analog conversion circuit is decreased by the current adjustment circuit by a predetermined amount to determine whether the value of current flowing into the unit current source falls within a predetermined range.

5. The semiconductor integrated circuit according to claim 2,
   wherein the first test circuit includes a current adjustment circuit configured to increase or decrease the amount of current of the first digital analog conversion circuit by a predetermined amount, and
   wherein the amount of current flowing into the second digital analog conversion circuit is compared with a first amount of current in which the amount of current flowing into the first digital analog conversion circuit is increased by the current adjustment circuit by a predetermined amount and a second amount of current in which the amount of current flowing into the first digital analog conversion circuit is decreased by the current adjustment circuit by a predetermined amount to determine whether the value of current flowing into the unit current source falls within a predetermined range.

* * * * *